US 8,344,508 B2
Jan. 1, 2013

(12) United States Patent
Hinomura

(54) SEMICONDUCTOR DEVICE AND FABRICATION METHOD THEREOF

(75) Inventor: Toru Hinomura, Osaka (JP)

(73) Assignee: Panasonic Corporation, Osaka (JP)

( * ) Notice: Subject to any disclaimer, the term of this patent is extended or adjusted under 35 U.S.C. 154(b) by 832 days.

(21) Appl. No.: 12/507,386

(22) Filed: Jul. 22, 2009

(65) Prior Publication Data
US 2009/0283910 A1 Nov. 19, 2009

Related U.S. Application Data

(63) Continuation of application No. PCT/JP2008/003522, filed on Nov. 28, 2008.

(30) Foreign Application Priority Data

Jan. 8, 2008 (JP) .................................. 2008-001394

(51) Int. Cl.
*H01L 23/535* (2006.01)
(52) U.S. Cl. .................. 257/751; 257/774; 257/E23.168
(58) Field of Classification Search .................. 438/108, 438/627, 637; 257/751, 774, E23.168
See application file for complete search history.

(56) References Cited

U.S. PATENT DOCUMENTS

| 7,884,475 | B2 * | 2/2011 | Gambino et al. ............. 257/751 |
| 7,928,476 | B2 * | 4/2011 | Kudo et al. .................... 257/211 |
| 2004/0238963 | A1 | 12/2004 | Fujisawa | |
| 2005/0218519 | A1 | 10/2005 | Koike et al. | |
| 2006/0267199 | A1 | 11/2006 | Ikeda | |
| 2007/0035032 | A1 | 2/2007 | Tsumura et al. | |
| 2007/0048931 | A1 | 3/2007 | Shimizu et al. | |
| 2007/0049024 | A1 | 3/2007 | Nakao et al. | |
| 2007/0173055 | A1 | 7/2007 | Ohtsuka et al. | |

FOREIGN PATENT DOCUMENTS

| JP | 2007-059660 | 3/2007 |
| JP | 2007-109687 | 4/2007 |
| JP | 2007-141927 | 6/2007 |
| JP | 2007-220738 | 8/2007 |
| JP | 2007-287816 | 11/2007 |

OTHER PUBLICATIONS

Koike, J., et al., "Self-forming diffusion barrier layer in Cu-Mn alloy metallization", Applied Physics Letter 87, 2005, American Institute of Physics.

* cited by examiner

*Primary Examiner* — Roy Potter
(74) *Attorney, Agent, or Firm* — McDermott Will & Emery LLP

(57) ABSTRACT

A semiconductor device includes: a metal-containing compound layer on a semiconductor substrate; a dielectric film on the semiconductor substrate and the metal-containing compound layer; a contact hole penetrating through the dielectric film to reach the metal-containing compound layer; a contact plug in the contact hole. The semiconductor device further includes a manganese oxide layer extending between the contact plug and respective one of the dielectric film and the metal-containing compound layer.

23 Claims, 11 Drawing Sheets (a)

(b)

(a)

(b)

(a)

(b)

(a)

(b)

(a)

(c)

(b)

(d)

(a)

(b)

(a)

(b)

US 8,344,508 B2

SEMICONDUCTOR DEVICE AND FABRICATION METHOD THEREOF

CROSS-REFERENCE TO RELATED APPLICATIONS

This application is a continuation of International Application No. PCT/JP2008/003522, with an International filing date of Nov. 28, 2008, which claims priority of Japanese Patent Application No. 2008-001394, filed on Jan. 8, 2008, the contents of which are hereby incorporated by reference.

BACKGROUND

Along with the advancement of semiconductor device microfabrication, decrease in resistance has been demanded of contacts which electrically connect a diffusion layer, which includes source regions, drain regions, etc., and a wiring layer. To this end, conventional contact formation with tungsten has been gradually replaced by contact formation with copper which is a lower resistance material. An example of such copper contact formation is described below with reference to FIGS. 9A-9D.

As shown in FIG. 9A, the initial steps are formation of device isolation (not shown) in a semiconductor substrate 1, implantation of impurities, and formation of a metal-containing compound layer 2. Thereafter, a first dielectric film 3 is formed over the semiconductor substrate 1 and the metal-containing compound layer 2 (a metal silicide layer formed over, for example, the source and drain regions). Then, a contact hole 4 is formed in the first dielectric film 3 using lithography, dry etching, wet etching, etc., so as to reach the metal-containing compound layer 2.

Then, part of the surface of the metal-containing compound layer 2 exposed at the bottom of the contact hole 4 is cleaned by argon sputtering, chemical dry etching, or the like. Thereafter, as shown in FIG. 9B, a barrier layer 5 is formed of a tantalum film, a tantalum nitride film, or a two-layered film of tantalum and tantalum nitride so as to cover the bottom and side wall of the contact hole 4 and the upper surface of the first dielectric film 3 using physical vapor deposition. Then, a seed layer 6 is formed by physical vapor deposition so as to cover the barrier layer 5. Then, a copper layer 7 is formed by electrolytic plating so as to fill the contact hole 4 in which the barrier layer 5 and the seed layer 6 have been formed.

Then, the semiconductor substrate 1 is thermally treated at a predetermined temperature, and thereafter, part of the barrier layer 5, the seed layer 6 and the copper layer 7 extending outside the contact hole 4 is removed by chemical mechanical polishing as shown in FIG. 9C, whereby a contact 8 is formed.

Then, as shown in FIG. 9D, a second dielectric film 9 and a third dielectric film 10 are formed in this order over the first dielectric film 3 and the contact 8. Then, a trench is formed in the second dielectric film 9 and the third dielectric film 10 so as to expose the upper surface of the contact 8. Then, a barrier layer 15, a seed layer 16, and a copper layer 17 are formed inside the trench, which constitute a first wiring layer 11. In this process, lithography, dry etching, wet etching, physical vapor deposition, chemical vapor deposition, and chemical mechanical polishing, etc., are used as necessary.

Thereafter, an upper contact hole, an upper wiring layer, etc., are formed (although none of these are shown), whereby fabrication of a semiconductor device is completed.

SUMMARY

However, in the above semiconductor device and its fabrication method, actual fabrication involves the following problems.

As shown in FIG. 9D, the barrier layer 5 extends over the bottom and side wall of the contact hole 4 in order to prevent diffusion of copper atoms of the copper layer 7 which is a constituent of the contact 8.

One of the requirements on the formation of the barrier layer 5 is a necessary and sufficient thickness at the bottom of the contact hole 4 which can prevent diffusion of copper atoms into the semiconductor substrate 1. At the same time, another requirement on the formation of the barrier layer 5 is formation of the contact hole 4 with a necessary and sufficient opening width which enables formation of the copper layer 7 by electrolytic plating so as to fill the contact hole 4 without formation of a void.

Here, the barrier layer 5 is formed by physical vapor deposition. However, one of the features of this technique is poor step coverage. Therefore, it is difficult to concurrently obtain a sufficient thickness of barrier at the bottom of the contact hole and a sufficient opening width of the contact hole 4 after the formation of the barrier layer 5. This problem applies particularly to a small contact hole with a high aspect ratio which results from the advancement of the semiconductor device microfabrication.

As shown in FIG. 10A, in the case of physical vapor deposition, due to its poor step coverage, the barrier layer 5 need to be deposited to a thickness greater than a desired thickness over the surface of the first dielectric film 3 in order to secure the desired thickness at the bottom of the contact hole 4. As a result, a significantly large overhang of the barrier layer 5 is formed at the opening of the contact hole 4, so that the opening width of the contact hole 4 after the formation of the barrier layer 5 is smaller. Therefore, as shown in FIG. 10B, a void 12 is formed during the formation of the copper layer 7 by electrolytic plating, resulting in filling failure.

Decreasing the thickness of the barrier layer 5 as shown in FIG. 10C for the purpose of avoiding formation of the void 12 results in an insufficient thickness of the barrier layer 5 at the bottom of the contact hole 4. As a result, diffusion of copper atoms from the seed layer 6 and the copper layer 7 cannot be prevented, and execution of the process steps up to FIG. 9D results in formation of copper silicide 13 as shown in FIG. 10D. This is a result of a reaction of copper atoms contained in the copper layer 7 which is a constituent of the contact 8 and silicon atoms contained in the substrate 1 or metal-containing compound layer 2 and can cause an operation failure in the semiconductor device.

Known countermeasures to this problem are, for example, the techniques disclosed in Japanese Laid-Open Patent Publication No. 2007-141927 and J. Koike et al., Applied Physics Letters 87, 041911 (2005). These are so-called self-aligning barrier formation technique with copper-manganese alloy layer, which is employed for copper wiring layers. This technique is described below.

As shown in FIG. 11A, in a trench formed in a first interlayer dielectric film 22, a barrier layer 25, a seed layer 26 and a copper layer 27 are formed. These layers constitute a lower wiring layer 21. Then, a second interlayer dielectric film 23 is formed on the first interlayer dielectric film 22 and the lower wiring layer 21. In the second interlayer dielectric film 23, a connection hole 28 is formed to reach the lower wiring layer 21, and an upper wiring trench 29 is formed over the connection hole 28 so as to be in communication with the connection hole 28.

Then, a copper-manganese alloy layer 30 is formed so as to cover the bottom and side wall of the connection hole 28, the bottom and side wall of the upper wiring trench 29, and the second interlayer dielectric film 23, without forming the barrier layer employed in the technique illustrated in FIGS. 9A to 9D. Then, a copper layer 31 is formed so as to fill the connection hole 28 and the upper wiring trench 29.

Then, the resultant structure is thermally treated so that manganese atoms contained in the copper-manganese alloy layer 30 diffuse into the second interlayer dielectric film 23 to cause reaction with oxygen atoms contained in the interlayer dielectric film 23, resulting in formation of a manganese oxide layer 32 over the surface of the second interlayer dielectric film 23. This is shown in FIG. 11B. The manganese oxide layer 32 formed serves as a barrier layer. Note that, at the bottom of the connection hole 28, oxygen atoms are not supplied because the copper layer 27 lies under the copper-manganese alloy layer 30, so that the manganese oxide layer is not formed at the bottom.

Part of the manganese atoms contained in the copper-manganese alloy layer 30 which are not used for the formation of the manganese oxide layer 32 are diffused away by the thermal treatment. Therefore, the copper-manganese alloy layer 30 is not remaining at the step shown in FIG. 11B.

Thereafter, part of the copper layer 31 and the manganese oxide layer 32 extending outside the upper wiring trench 29 is removed by chemical mechanical polishing, whereby the upper wiring layer is formed.

As described above, according to the techniques disclosed in JP 2007-141927 and Koike et al., the manganese oxide layer 32, which is a homogeneous barrier layer, can be formed over the side wall of the connection hole 28 and the bottom and side wall of the upper wiring trench 29.

However, a technique of this type cannot be applied to contacts which connect to a diffusion layer including source regions, drain regions, etc. Specifically, if this technique is applied to the contact hole 4 which is opened above the metal-containing compound layer 2 as shown in FIG. 9A, a manganese oxide layer 19 is not formed at the bottom of the contact hole 4 but over the side wall of the contact hole 4 as shown in FIG. 12A. This is because the metal-containing compound layer 2 lies under the bottom of the contact hole 4. The metal-containing compound layer 2 is commonly formed of a nickel-silicon intermetallic compound, a cobalt-silicon intermetallic compound, or the like, which does not supply oxygen atoms. Therefore, a manganese oxide layer as a barrier layer is not formed.

Thereafter, performing the subsequent process steps as illustrated in FIGS. 9C and 9D leads to diffusion of copper atoms from the copper layer 7 into the metal-containing compound layer 2 or the semiconductor substrate 1 because the barrier layer does not exists at the bottom of the contact hole 4, resulting in formation of the copper silicide 13 as shown in FIG. 12B. This can degrade device characteristics, or cause operation failures.

In view of the above, a semiconductor device in which a contact can be formed without formation of silicide of a constituent element of the contact even at the bottom of a small contact hole, and which is free of deteriorations in device characteristics and is of high fabrication yield, and a fabrication method thereof, are described below.

An example semiconductor device disclosed in this specification includes a metal-containing compound layer on a semiconductor substrate; a dielectric film on the semiconductor substrate and the metal-containing compound layer; a contact hole penetrating through the dielectric film to reach the metal-containing compound layer; a contact plug in the contact hole; and a manganese oxide layer extending between the contact plug and respective one of the dielectric film and the metal-containing compound layer.

In the above-described semiconductor device, the manganese oxide layer is provided between the contact plug which serves as a conductor and a dielectric film (i.e., over the side wall of the contact hole) and between the contact plug and the metal-containing compound layer (i.e., over the bottom of the contact hole).

Since the manganese oxide layer serves as a barrier layer, the elements which constitute the contact plug are prevented from diffusing into the bottom and side wall of the contact hole. Also, by using the fabrication method of the semiconductor device which will be described later, the manganese oxide layer can be formed so as to have a sufficient thickness at the bottom of the contact hole while formation of silicide of an element which is a constituent of the contact plug under the contact can be prevented. Furthermore, according to the fabrication method which will be described later, formation of a void in the contact plug can be prevented.

Preferably, the semiconductor device may further include an oxygen-containing titanium layer extending between the contact plug and the manganese oxide layer or between the manganese oxide layer and respective one of the dielectric film and the metal-containing compound layer.

The oxygen-containing titanium layer is useful for the formation of the manganese oxide layer as will be described later. When the oxygen-containing titanium layer is provided between the manganese oxide layer and the metal-containing compound layer, the oxygen-containing titanium layer is useful for reduction of the interfacial resistance between the metal-containing compound layer and the manganese oxide layer and hence for reduction of the contact resistance. Thus, a contact with a reduced resistance can be formed.

Preferably, the metal-containing compound layer may include silicon and at least one of cobalt, nickel, germanium and platinum. In the case where the metal-containing compound layer includes a plurality of metals, an alloy of the metals may be formed.

Preferably, the dielectric film may be a single-layer oxygen-containing dielectric film or a multilayered film including a plurality of oxygen-containing dielectric films.

To form the manganese oxide layer, the above structure may be preferable.

Preferably, the oxygen-containing dielectric film may be at least one of P-TEOS (plasma tetraetylorthosilicate) film, PSG (phospho silicate glass) film, BPSG (borophosphosilicate glass) film, NSG (nondoped silicate glass) film and FSG (fluorine doped silicate glass) film. These films are specific examples of the oxygen-containing dielectric film.

Preferably, the contact plug may contain copper. The semiconductor device may be especially useful for a semiconductor device which has copper wires.

Preferably, the semiconductor device may further include a wire on the dielectric film for connecting to the contact plug.

A first example semiconductor device fabrication method includes (a) forming a metal-containing compound layer on a semiconductor substrate; (b) forming a dielectric film on the semiconductor substrate and the metal-containing compound layer; (c) forming a contact hole in the dielectric film to reach the metal-containing compound layer; (d) after (c), oxidizing part of the metal-containing compound layer exposed at a bottom of the contact hole to form an oxygen- and metal-containing compound layer; (e) forming a manganese-containing alloy layer over the bottom and side wall of the contact hole; (f) after (e), forming a contact plug to fill the contact hole; and (g) after (f), forming a manganese oxide layer from the manganese-containing alloy layer by a thermal treatment.

According to the first example semiconductor device fabrication method, the manganese-containing alloy layer is formed over the bottom and side wall of the contact hole after the formation of the oxygen- and metal-containing compound layer over the bottom of the contact hole. Therefore, the thermal treatment at (g) results in supply of oxygen to the manganese-containing alloy layer not only over the side wall of the contact hole but over the bottom so that the manganese oxide layer can be formed.

In this way, the manganese oxide layer which serves as a barrier layer can be formed so as to have a thickness at the bottom of the contact hole. Therefore, even in a semiconductor device which has a small contact hole, formation of silicide of a constituent element of a contact in an area underlying the contact can be prevented. In the first example semiconductor device fabrication method, the barrier layer is formed after the formation of the contact plug in the contact hole so that formation of a void can be prevented whereas in the prior art the contact hole has a narrowed opening due to the formation of the barrier layer, resulting in disadvantageous formation of a void in the contact plug.

Preferably, (d) may include performing plasma ashing using a gas which contains oxygen and at least one of fluorine and fluorine compound.

This is a useful example method for provision of oxygen to a metal-containing compound layer for the purpose of preparing an oxygen- and metal-containing compound layer.

A second example semiconductor device fabrication method includes (a) forming a metal-containing compound layer on a semiconductor substrate; (b) forming a dielectric film on the semiconductor substrate and the metal-containing compound layer; (c) forming a contact hole in the dielectric film to reach the metal-containing compound layer; (d) after (c), forming an oxygen-containing titanium layer over a bottom and side wall of the contact hole; (e) after (c) and before or after (d), forming a manganese-containing alloy layer over the bottom and side wall of the contact hole; (f) after (d) and (e), forming a contact plug to fill the contact hole; and (g) after (f), forming a manganese oxide layer from the manganese-containing alloy layer by a thermal treatment.

According to the second example semiconductor device fabrication method, the oxygen-containing titanium layer and the manganese-containing alloy layer are formed in the form of a laminate over the bottom and side wall of the contact hole, and the manganese oxide layer is formed from the manganese-containing alloy layer by a thermal treatment. In this process, oxygen is supplied from the oxygen-containing titanium layer so that the manganese oxide layer can be formed to a sufficient thickness at the bottom of the contact hole. Therefore, even in a semiconductor device which has a small contact hole, formation of silicide of a constituent element of a contact in an area underlying the contact can be prevented. In the second example semiconductor device fabrication method, the barrier layer is formed after the formation of the contact plug in the contact hole so that formation of a void can be prevented whereas in the prior art the contact hole has a narrowed opening due to the formation of the barrier layer, resulting in disadvantageous formation of a void in the contact plug.

Preferably, (d) may include forming the oxygen-containing titanium layer by reduction of a titanium-containing compound. Preferably, the titanium-containing compound may be at least one of titanium tetrachloride, titanium tetrabromide and titanium tetraiodide. Preferably, the reduction may be carried out using hydrogen plasma.

This is an example formation method of the oxygen-containing titanium layer.

Preferably, (d) may include forming the oxygen-containing titanium layer by forming a titanium film and then oxidizing the titanium film. Preferably, oxidizing the titanium film may include exposing the titanium film to ambient air. Preferably, oxidizing the titanium film may include exposing the titanium film to a plasma atmosphere which contains oxygen.

Also, the titanium film can be formed by physical vapor deposition.

This is another example method for forming the oxygen-containing titanium layer.

Preferably, in the first and second example semiconductor device fabrication methods, the metal-containing compound layer may include silicon and at least one of cobalt, nickel, germanium and platinum.

Preferably, the dielectric film may be a single-layer oxygen-containing dielectric film or a multilayered film including a plurality of oxygen-containing dielectric films.

This is a preferable condition for the formation of the manganese oxide layer.

Preferably, the oxygen-containing dielectric film may be at least one of P-TEOS film, PSG film, BPSG film, NSG film and FSG film. These materials are specific examples of the oxygen-containing dielectric film.

By using the above-described semiconductor devices and fabrication methods thereof, the barrier layer can be formed of manganese oxide over the bottom of the contact hole, and conformal barrier formation over the bottom and side wall of the contact hole can be implemented. Therefore, a copper contact of low resistance can be formed without forming copper silicide even at the bottom of a small contact hole. As a result, a semiconductor device which has copper contacts can be fabricated with high fabrication yield without deteriorating the device characteristics.

BRIEF DESCRIPTION OF THE DRAWINGS

FIG. 7 illustrates another method of forming an oxygen-containing titanium layer of the semiconductor device 100a.

DETAILED DESCRIPTION

Embodiment 1

Hereinafter, an example semiconductor device and a fabrication method thereof according to embodiment 1 are described with reference to the drawings. FIGS. 1A, 1B, 2A, 2B, and 3 are schematic cross-sectional views illustrating the example semiconductor device 100 and the fabrication method.

Figure 3:
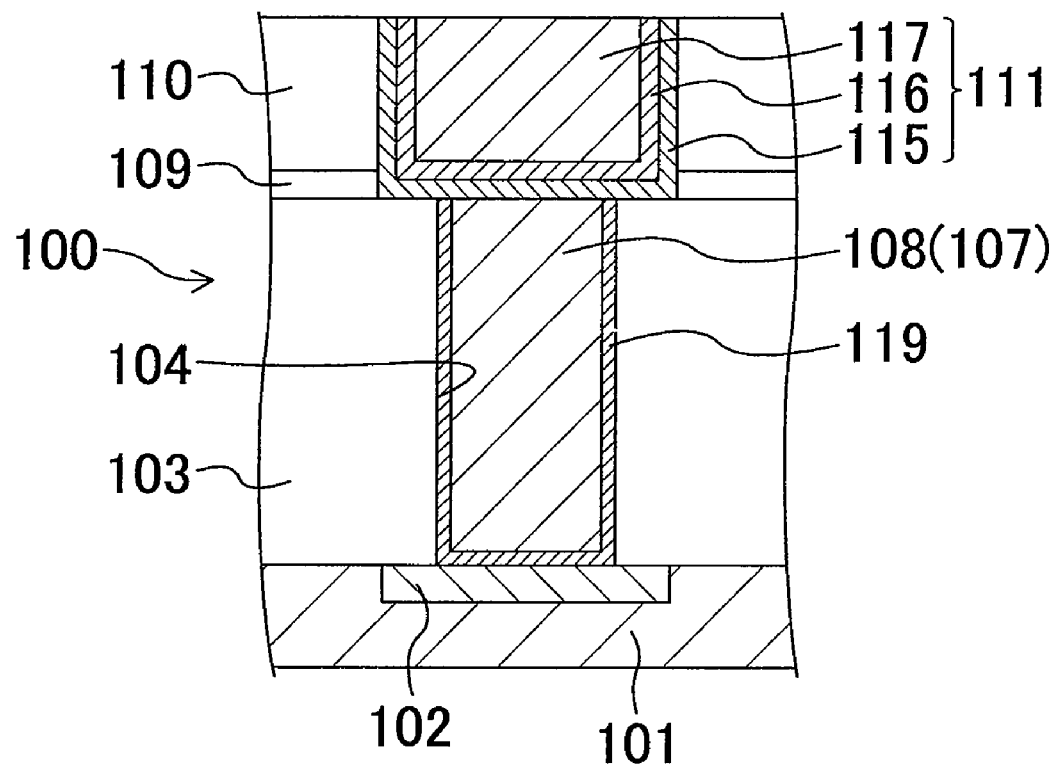
FIG. 3 is a schematic cross-sectional view illustrating the semiconductor device 100 and the fabrication method, which is subsequent to FIG. 2B.

The example semiconductor device 100 of this embodiment is fabricated using a semiconductor substrate 101 as shown in FIG. 3. A metal-containing compound layer 102 is provided on the semiconductor substrate 101, which is a metal silicide layer provided on a diffusion layer including source regions and drain regions (not shown). A first dielectric film 103 is provided on the semiconductor substrate 101 and the metal-containing compound layer 102. The first dielectric film 103 is provided with a contact hole 104 reaching the metal-containing compound layer 102. A manganese oxide layer 119 extends so as to cover the bottom and side wall of the contact hole 104. The contact hole 104 is filled with a copper layer 107 formed over the layer 119. The copper layer 107 serves as a conductive layer. The copper layer 107 forms a contact plug 108. In other words, the manganese oxide layer 119 extends between the copper layer 107 (contact plug 108) and the first dielectric film 103 and between the copper layer 107 and the metal-containing compound layer 102. Note that the dimension of the contact plug 108 is 100 nm or less.

A second dielectric film 109 and a third dielectric film 110 are provided on the first dielectric film 103. The second dielectric film 109 and the third dielectric film 110 are provided with an upper wiring trench reaching the contact plug 108. The upper wiring trench is covered with a barrier layer 115 and a seed layer 116 and is filled with a copper layer 117 formed thereover. These elements constitute an upper wire 111.

Figure 10:
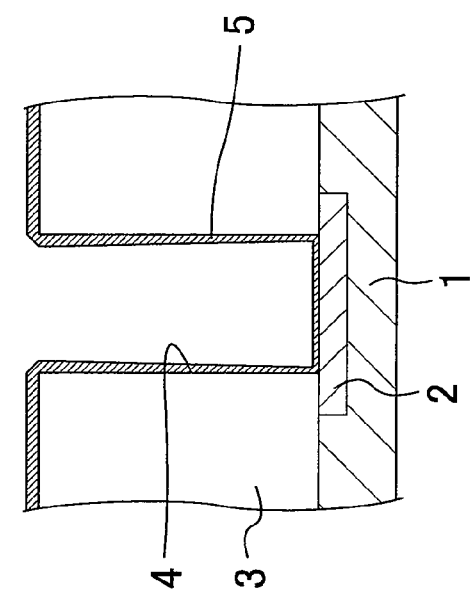
FIGS. 10A-10D illustrate problems involved in the background art semiconductor device.
Figure 10:
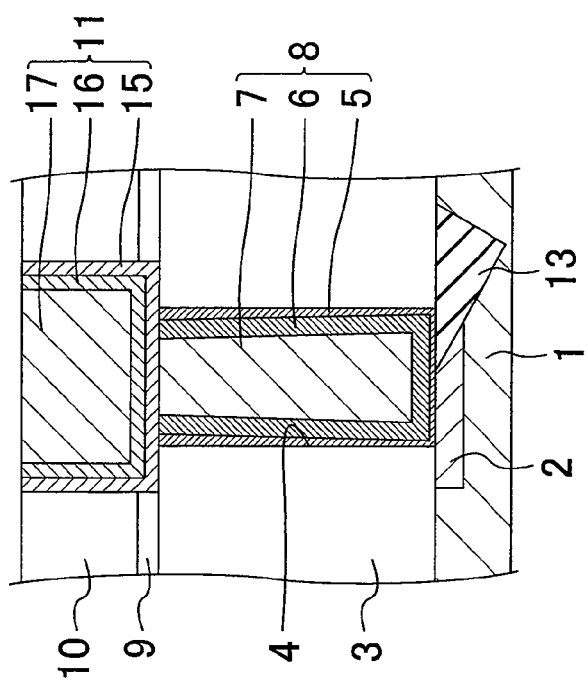
Figure 10:
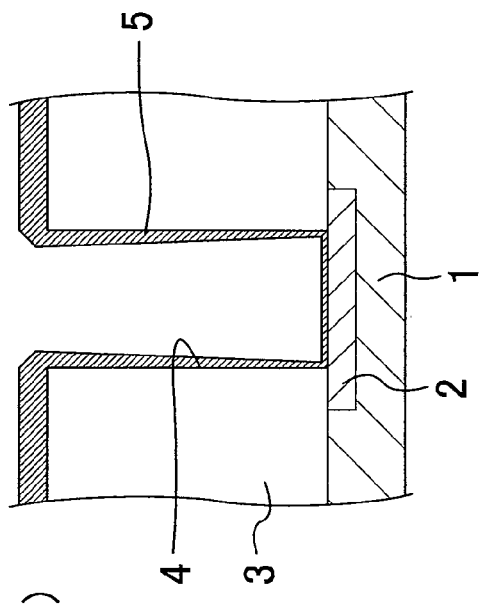
Figure 10:
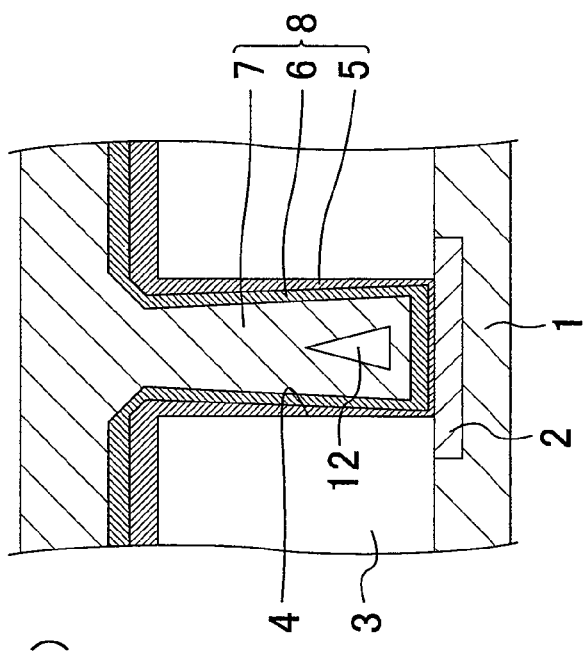
Figure 11:
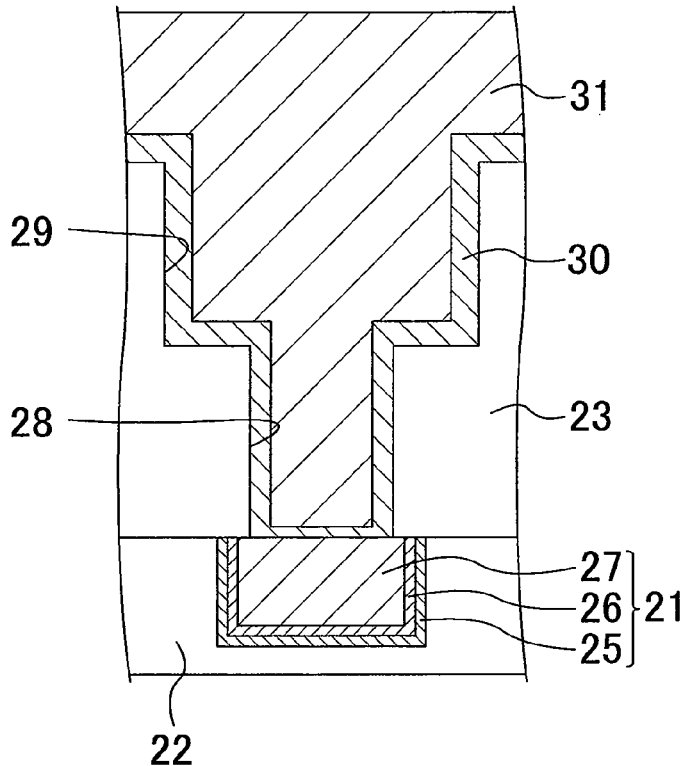
FIGS. 11A and 11B illustrate background art disclosed in known documents.
Figure 11:
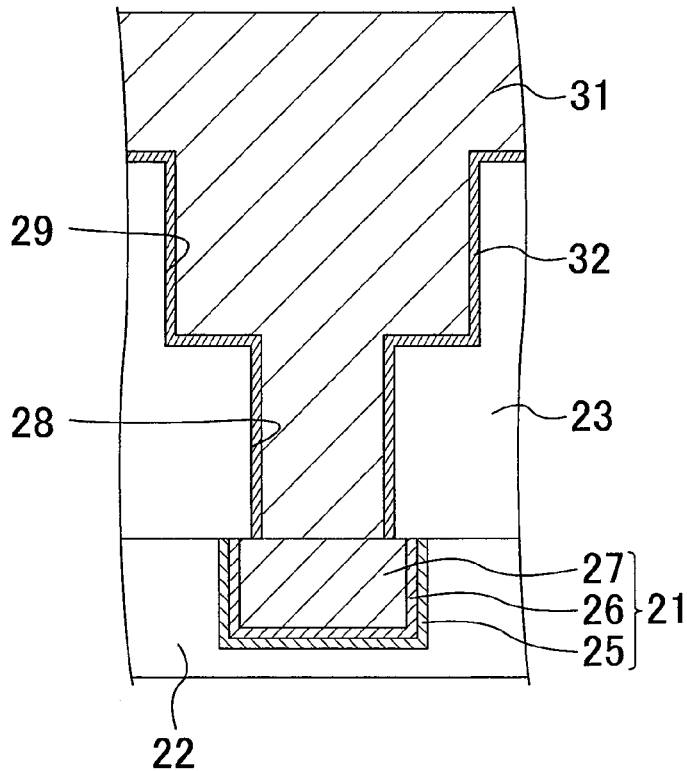
Figure 12:
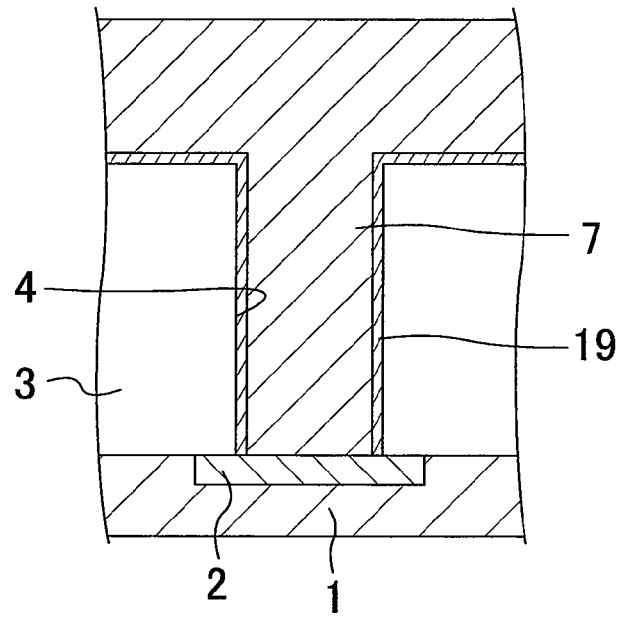
FIGS. 12A and 12B illustrate the problems which would occur in application of the techniques disclosed in the known documents to copper contacts.
Figure 12:
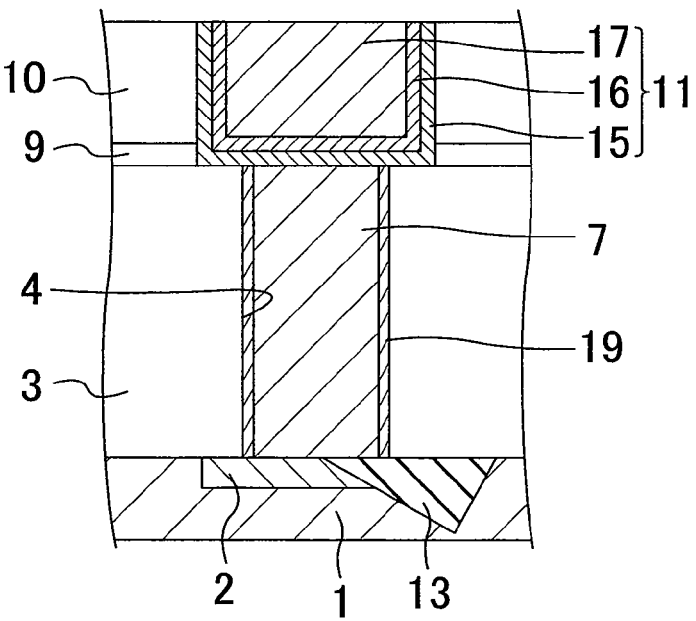

In the semiconductor device 100 having such a structure, the manganese oxide layer 119 serves as a barrier layer to prevent copper atoms contained in the copper layer 107 from diffusing into an area underlying the bottom of the contact hole 104 and forming copper silicide. Here, the manganese oxide layer 119 can be formed uniformly over the bottom and side wall of the contact hole 104. Specifically, the manganese oxide layer 119 can be formed so as to have a sufficient thickness at the bottom of the contact hole 104. Also, the contact hole 104 is satisfactorily filled with the copper layer 107 so that formation of a void (see the prior art illustrated in FIG. 10B) can be prevented for the reasons that will be described later.

Next, the fabrication method of the semiconductor device 100 is described.

Figure 1:
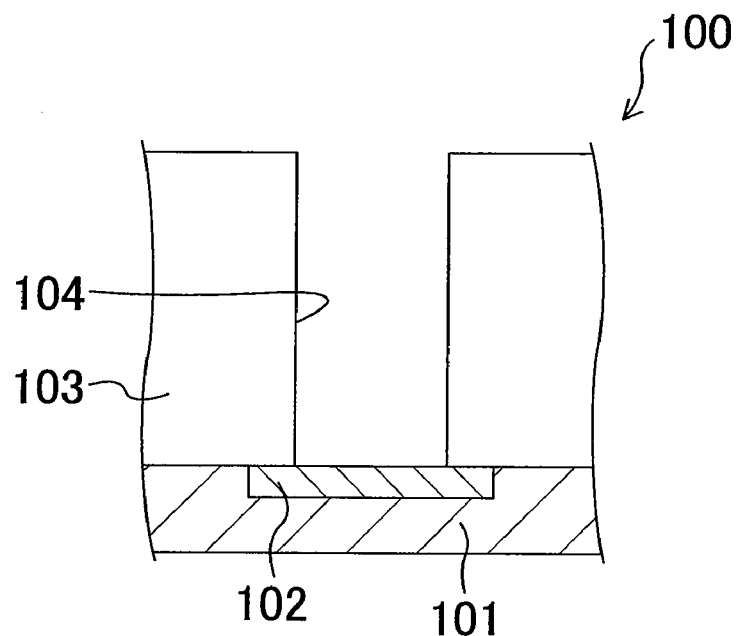
FIGS. 1A and 1B are schematic cross-sectional views illustrating an example semiconductor device 100 and a fabrication method thereof according to embodiment 1 of the disclosure of this specification.
Figure 1:
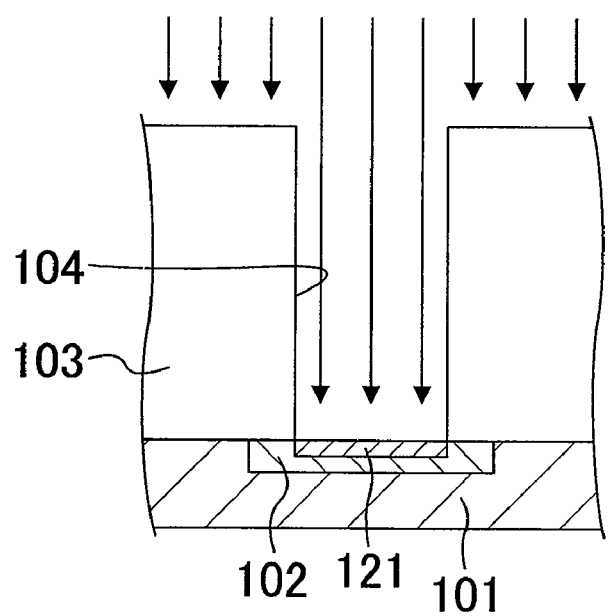

First, as shown in FIG. 1A, a semiconductor substrate 101 undergoes formation of device isolation (not shown) and implantation of impurities, and then, a metal-containing compound layer 102 is formed on the semiconductor substrate 101. Then, a first dielectric film 103 is formed on the semiconductor substrate 101 and the metal-containing compound layer 102. Then, a contact hole 104 is formed in the first dielectric film 103 using lithography, dry etching, wet etching, etc., so as to reach the metal-containing compound layer 102.

Here, the metal-containing compound layer 102 contains one or more metal elements and silicon element. The metal element may be one of cobalt, nickel, germanium, and platinum, or a combination of any two or more of these elements.

The first dielectric film 103 shown in FIG. 1A is in the form of a single-layer structure of a single film, to which the present invention is not limited. The first dielectric film 103 may have a multilayered structure of two or more (or two or more types of) dielectric films. This case can also provide the advantages of this embodiment. The first dielectric film 103 may be of any film type so long as it is a dielectric film which contains oxygen. Specific examples of the first dielectric film 103 include a P-TEOS film, a PSG film, a BPSG film, an NSG film, and an FSG film. The first dielectric film 103 may be formed by a single-layer film or a multilayered film of two or more layers selected from among these specific examples.

Then, as shown in FIG. 1B, the resultant structure is subjected to ashing with a gas source which contains oxygen and at least one of fluorine and a fluorine compound, so that part of the metal-containing compound layer 102 exposed at the bottom of the contact hole 104 is oxidized, whereby an oxygen- and metal-containing compound layer 121 is formed at the bottom of the contact hole 104.

Figure 2:
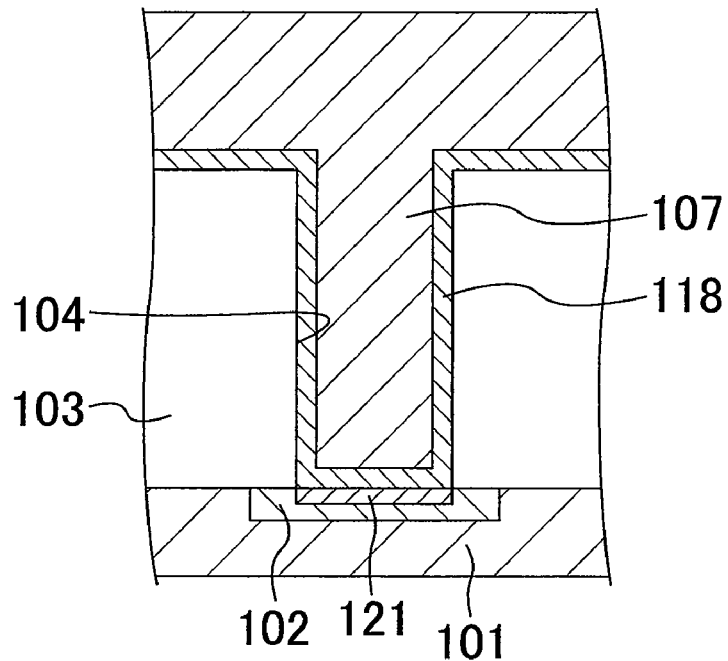
FIGS. 2A and 2B are schematic cross-sectional views illustrating the semiconductor device 100 and the fabrication method, which are subsequent to FIG. 1B.
Figure 2:
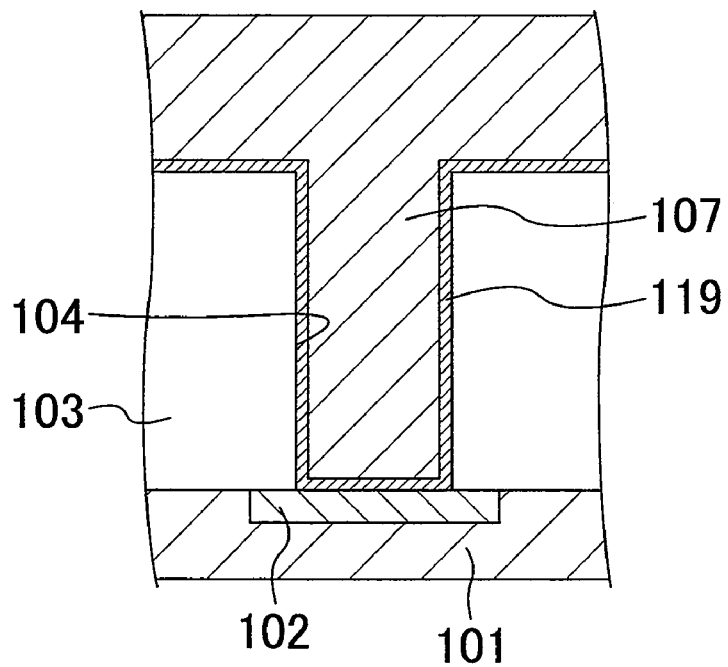

Then, as shown in FIG. 2A, a copper-manganese alloy layer 118 (manganese-containing alloy layer) is formed by physical vapor deposition over the bottom and side wall of the contact hole 104 and over the first dielectric film 103. Then, a copper layer 107 is formed by plating over the copper-manganese alloy layer 118 so as to fill the contact hole 104. At this point in time, the contact hole 104 has a sufficiently wide opening even after the formation of the copper-manganese alloy layer 118 so that formation of a void in the copper layer 107 can be prevented whereas in the prior art (FIG. 10B) the contact hole 4 has a narrowed opening due to the barrier layer 6. Note that the copper-manganese alloy layer 30 serves as a seed layer during the plating.

Then, as shown in FIG. 2B, the resultant structure is thermally treated so that manganese atoms contained in the copper-manganese alloy layer 118 are diffused. Accordingly, in the side wall of the contact hole 104, the manganese atoms diffused out of the copper-manganese alloy layer 118 cause a reaction with oxygen atoms contained in the first dielectric film 103 so that a manganese oxide layer 119 is formed. At the same time, also at the bottom of the contact hole 104, the manganese atoms diffused out of the copper-manganese alloy layer 118 cause a reaction with oxygen atoms contained in the oxygen- and metal-containing compound layer 121 so that the manganese oxide layer 119 is formed. Thus, the thermal treatment leads to the formation of the manganese oxide layer 119 over the bottom and side wall of the contact hole 104. The manganese atoms contained in the copper-manganese alloy layer 118 can be used in the formation of the manganese oxide layer 119 or can be diffused away, so that the copper-manganese alloy layer 118 is not remaining in the step of FIG. 2B.

Meanwhile, the oxygen contained in the oxygen- and metal-containing compound layer 121 is consumed out so that the oxygen- and metal-containing compound layer 121 is restored to the metal-containing compound layer 102.

Thereafter, unnecessary part of the manganese oxide layer 119 and the copper layer 107 extending above the first dielectric film 103 (outside the contact hole 104) is removed using chemical mechanical polishing, whereby a contact plug 108 is formed in the contact hole 104 as shown in FIG. 3.

Thereafter, a second dielectric film 109 and a third dielectric film 110 are formed, and an upper wiring trench is formed. Then, a barrier layer 115, a seed layer 116 and a copper layer 117 are sequentially formed in the upper wiring trench to form an upper wire 111. Thus, the semiconductor device 100 is fabricated.

To form the oxygen- and metal-containing compound layer 121 shown in FIG. 1B, ashing is performed with a gas source which contains oxygen and at least one of fluorine and a fluorine compound. The reason for performing the ashing is described below.

The thickness of the manganese oxide layer 119 formed in the semiconductor device 100 depends on the amount of oxygen supplied to the manganese atoms contained in the copper-manganese alloy layer 118 (see FIG. 2A). Therefore, the thickness of the oxygen- and metal-containing compound layer 121 need to be controlled according to a required thickness of the manganese oxide layer 119.

Since etching and ashing with oxygen gas are common procedures in the contact hole formation, part of the metal-containing compound layer which is exposed at the bottom of the contact hole is oxidized during the contact hole formation.

However, in the case of etching or ashing with oxygen gas, the surface of the metal-containing compound layer becomes passive (i.e., falls in a state where an oxide film resistant to corrosion is formed over the metal surface). Therefore, oxidation of the metal-containing compound layer does not progress much in the depth direction of the film. For example, in the case of a nickel-silicon metal-containing compound, the thickness of the oxide layer formed is known to be less than about 1-2 nm. When using such common etching or ashing with oxygen gas, it would be difficult to control the thickness of the oxygen- and metal-containing compound layer 121 as described above, and it would be also difficult to achieve a thickness required in this embodiment. Here, to form the manganese oxide layer 119 so as to have the required thickness, it is necessary to form the oxygen- and metal-containing compound layer so as to have a thickness in the range of, for example, 2 nm to 3 nm. Thus, only performing etching or ashing with oxygen gas would be insufficient.

When a fluorine element is contained in a gas used in etching or ashing, oxidation of the nickel-silicon metal-containing compound is not limited to the surface but can progress under the surface in the depth direction. Therefore, using this method enables the resultant oxygen- and metal-containing compound layer 121 to have the desired thickness (for example, 2 nm to 3 nm).

For the above reason, in the formation of the oxygen- and metal-containing compound layer 121 in this embodiment, ashing is carried out using a gas source which contains oxygen and at least one of fluorine and a fluorine compound.

The thickness of the thus-formed oxygen- and metal-containing compound layer 121 can be described as below.

During the thermal treatment, the oxygen- and metal-containing compound layer 121 supplies oxygen to the manganese atoms contained in the copper-manganese alloy layer 118. Accordingly, the manganese atoms and the oxygen atoms cause a reaction to form the manganese oxide layer 119.

The thickness of the resultant manganese oxide layer 119 depends on the amount of the manganese atoms contained in the copper-manganese alloy layer 118, the amount of oxygen atoms supplied from the oxygen- and metal-containing compound layer 121, and the conditions of the thermal treatment on the semiconductor substrate 101. For example, when the oxygen- and metal-containing compound layer 121 has an excessive thickness, part of the oxygen atoms remain unconsumed so that the oxygen- and metal-containing compound layer 121 partially remains. The oxygen- and metal-containing compound layer 121 has a higher resistance than the metal-containing compound layer 102, which can be a cause of increased contact resistance, resulting in deteriorations in device characteristics and production yield.

In view of such circumstances, the oxygen- and metal-containing compound layer 121 desirably has such a thickness which is thick enough for the formation of the manganese oxide layer 119 to a sufficient thickness such that the layer 119 can serve as a barrier layer to prevent diffusion of copper atoms, and which is thin enough for the compound layer 121 to disappear after the formation of the manganese oxide layer 119.

Embodiment 2

Hereinafter, an example semiconductor device and a fabrication method thereof according to embodiment 2 are described with reference to the drawings. FIGS. 4A, 4B, 5A, and 5B are schematic cross-sectional views illustrating the example semiconductor device 100a and the fabrication method.

Figure 5:
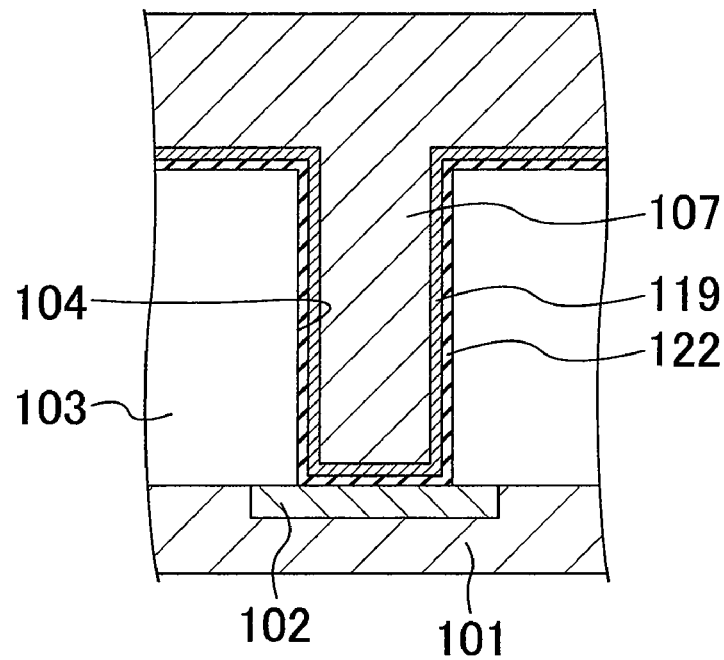
FIGS. 5A and 5B are schematic cross-sectional views illustrating the semiconductor device 100a and the fabrication method, which are subsequent to FIG. 4B.
Figure 5:
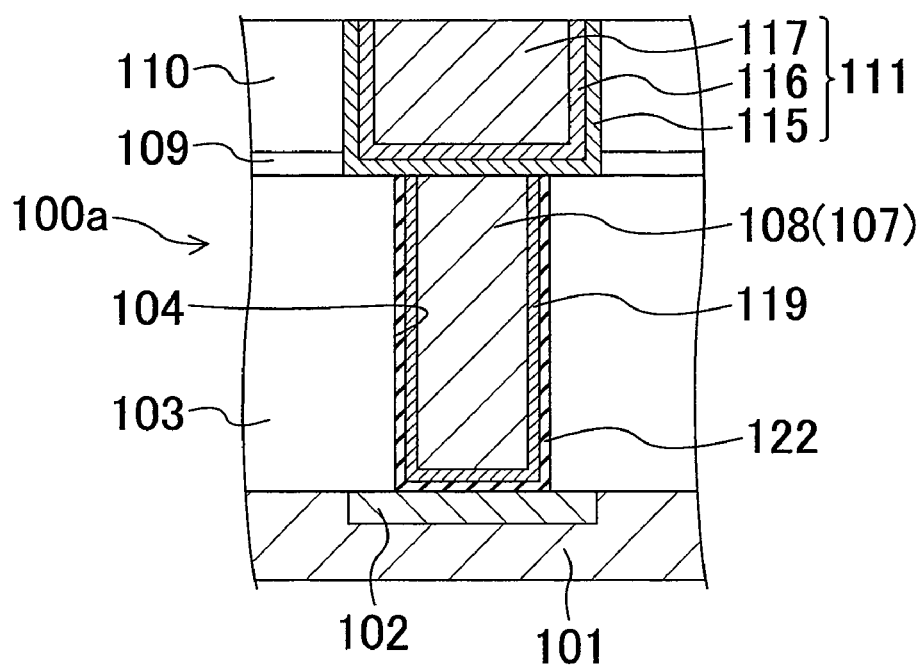

The semiconductor device 100a has the structure shown in FIG. 5B. Specifically, the semiconductor device 100a includes, in addition to the elements of the semiconductor device 100 of embodiment 1, an oxygen-containing titanium layer 122 extending over the bottom and side wall of the contact hole 104, i.e., extending between the first dielectric film 103 and metal-containing compound layer 102 and the manganese oxide layer 119.

In the above-described semiconductor device 100a also, the manganese oxide layer 119 can serve as a barrier layer which prevents diffusion of copper atoms of the copper layer 107, and the manganese oxide layer 119 can be uniformly formed, as in embodiment 1. Also, formation of copper silicide and formation of a void can advantageously be prevented as in embodiment 1.

Due to the oxygen-containing titanium layer 122, the oxygen- and metal-containing compound layer 121 (see FIG. 1B) which is used in embodiment 1 for the formation of the manganese oxide layer 119 is not necessary as will be described later.

Due to the oxygen-containing titanium layer 122, the contact resistance can be reduced.

Forming the titanium layer and the oxygen-containing titanium layer over the bottom and side wall of the contact hole has also been a common procedure among the prior art tungsten contacts. By inserting such a layer between the metal-containing compound layer and a tungsten layer or a titanium nitride layer which serves as a barrier layer, the interfacial resistance between the metal-containing compound layer and the contact can be reduced, and the contact resistance can be reduced.

In the example semiconductor device 100a of this embodiment, the contact resistance can also be reduced by providing the oxygen-containing titanium layer 122 (or titanium layer) between the metal-containing compound layer 102 and the manganese oxide layer 119. Therefore, the contact resistance of the semiconductor device 100a is lower than that of the semiconductor device 100 of embodiment 1.

Next, a fabrication method of the semiconductor device 100a is described.

First, the step illustrated with reference to FIG. 1A in embodiment 1 is performed. In the resultant structure as shown in FIG. 1A, the metal-containing compound layer 102 is provided on the semiconductor substrate 101, and the first dielectric film 103 having the contact hole 104 is provided on the semiconductor substrate 101 and the metal-containing compound layer 102.

Then, an oxide layer (not shown) formed on part of the surface of the metal-containing compound layer 102 which is exposed at the bottom of the contact hole 104 is removed by Ar sputtering or chemical cleaning. Thereafter, as shown in FIG. 4A, an oxygen-containing titanium layer 122 is formed over the bottom and side wall of the contact hole 104 and the first dielectric film 103 by chemical vapor deposition.

Figure 4:
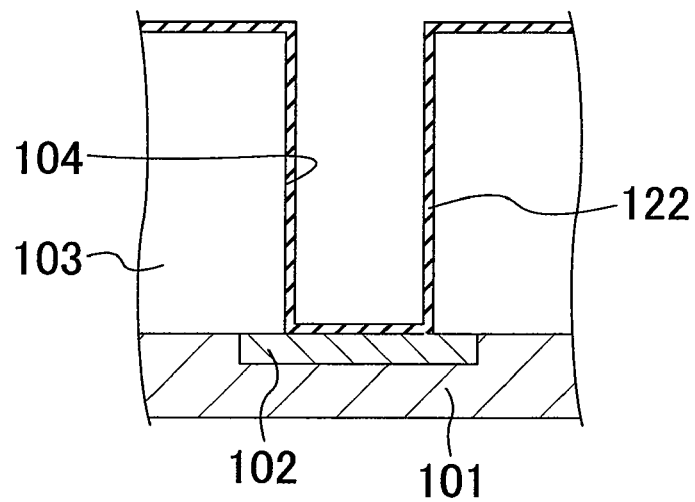
FIGS. 4A and 4B are schematic cross-sectional views illustrating an example semiconductor device 100a and a fabrication method thereof according to embodiment 2 of the disclosure of this specification.
Figure 4:
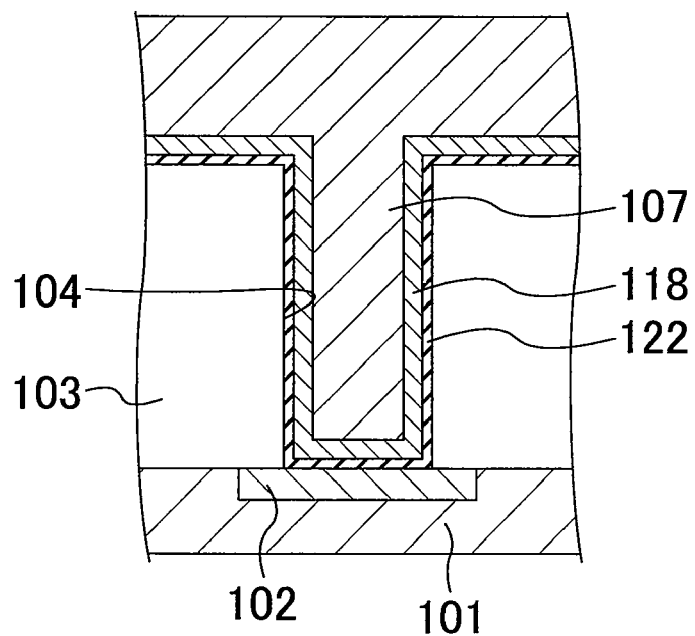

Then, as shown in FIG. 4B, a copper-manganese alloy layer 118 is formed so as to cover the oxygen-containing titanium layer 122. Then, a copper layer 107 is formed by electrolytic plating so as to fill the contact hole 104 in which the oxygen-containing titanium layer 122 and the copper-manganese alloy layer 118 have been formed.

Then, as shown in FIG. 5A, the resultant structure is thermally treated so that a manganese oxide layer 119 is formed so as to cover the oxygen-containing titanium layer 122. The manganese oxide layer 119 is formed by a reaction of manganese atoms contained in the copper-manganese alloy layer 118 and oxygen atoms contained in the oxygen-containing titanium layer 122. Since the oxygen-containing titanium layer 122 extends over the bottom and side wall of the contact hole 104, the manganese oxide layer 119 is also formed so as to extend over the bottom and side wall of the contact hole 104. Note that oxygen contained in the oxygen-containing titanium layer 122 may be consumed so that the layer 122 can be transformed into a layer which can be called a titanium layer (though in FIG. 5A referred to by the original name, the oxygen-containing titanium layer 122).

Then, unnecessary part of the oxygen-containing titanium layer 122, the manganese oxide layer 119, and the copper layer 107 extending above the first dielectric film 103 (outside the contact hole 104) is removed using chemical mechanical polishing, whereby a contact plug 108 is formed in the contact hole 104 as shown in FIG. 5B.

Then, a second dielectric film 109 and the third dielectric film 110 are formed, and an upper wiring trench is formed in the films 109 and 110. In the upper wiring trench, a barrier layer 115, a seed layer 116, and a copper layer 117 are sequentially formed. These layers constitute the upper wire 111. Thus, the semiconductor device 100a is fabricated.

As described above, in this embodiment, the oxygen-containing titanium layer 122 is formed instead of providing the oxygen- and metal-containing compound layer 121 of embodiment 1. This structure also enables the supply of oxygen atoms to the copper-manganese alloy layer 118 so that the manganese oxide layer 119 which serves as a barrier layer can be formed.

Note that the oxygen-containing titanium layer 122 may be replaced by a different oxide layer. Any material can be used instead of titanium oxide so long as it contains a sufficient amount of oxygen and does not exhibit a large increase in specific resistance.

Next, a method of forming the oxygen-containing titanium layer 122 is described.

In the fabrication method of the semiconductor device 100a, the oxygen-containing titanium layer 122 may preferably be formed by chemical vapor deposition which utilizes hydrogen plasma reduction of titanium tetrachloride ($TiCl_4$) for the reasons described below.

A titanium film formed by physical vapor deposition scarcely contains oxygen. On the other hand, film formation by hydrogen plasma reduction of titanium tetrachloride results in formation of a film of titanium oxide. This film contains a larger amount of oxygen than that formed by physical vapor deposition.

Figure 6:
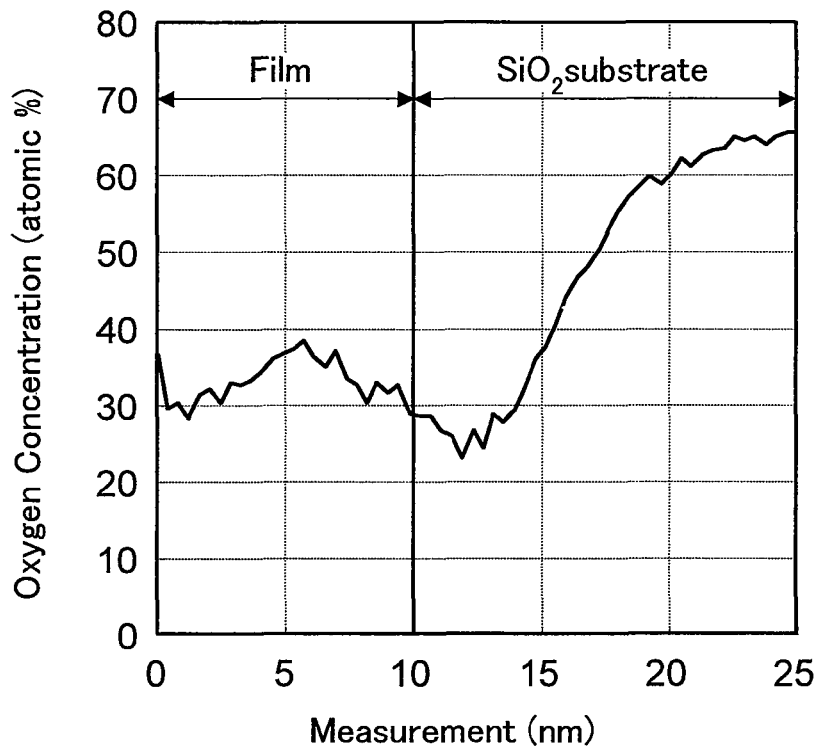
FIG. 6 shows the result of an oxygen concentration analysis by XPS of a titanium film formed by hydrogen plasma reduction of titanium tetrachloride.

FIG. 6 shows the result of an oxygen concentration analysis by XPS (X-ray photoelectron spectroscopy) of a titanium film formed by hydrogen plasma reduction of titanium tetrachloride. The film contains about 30 atomic % of oxygen atoms, which is higher than the percentage of oxygen atoms contained in the titanium film formed by physical vapor deposition.

The amount of oxygen atoms contained in a titanium film formed by physical vapor deposition (PVD-Ti film) is generally about 2 atomic % or less. The thickness of the PVD-Ti film formed at the bottom of the contact hole is generally about 5 nm, which is substantially equal to 15 atomic layers. Assuming that 2% of the 15 atomic layers is oxygen, about 0.3 atomic layer equals to the amount of oxygen contained in the PVD-Ti film. This oxygen amount is insufficient for supply of oxygen for the formation of the manganese oxide layer 119.

To overcome this insufficiency, film formation is carried out by hydrogen plasma reduction of titanium tetrachloride, so that a titanium oxide film containing a sufficient amount of oxygen can be formed. Thus, oxygen atoms supplied from this film cause a reaction with manganese atoms contained in the copper-manganese alloy layer 118 so that the manganese oxide layer 119 can be formed.

For the above reason, the oxygen-containing titanium layer 122 may preferably be formed by chemical vapor deposition which utilizes hydrogen plasma reduction of titanium tetrachloride.

However, the present invention is not limited to the above example. The oxygen-containing titanium layer 122 may be formed by reduction of a titanium compound. Other available examples than titanium tetrachloride include titanium tetrabromide ($TiBr_4$) and titanium tetraiodide ($TiI_4$).

Figure 7:
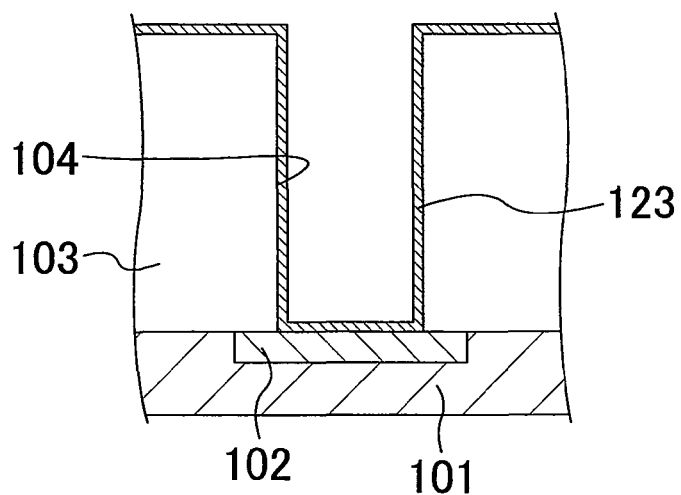

Although the example method described above may be a preferable method, a titanium layer formed by physical vapor deposition can be used. To this end, after the structure of FIG. 1A has been prepared, the oxide layer formed over part of the surface of the metal-containing compound layer 102 which is exposed at the bottom of the contact hole 104 is removed by Ar sputtering or chemical cleaning. Subsequently, as shown in FIG. 7, a titanium layer 123 is formed by physical vapor deposition over the bottom and side wall of the contact hole 104 and the first dielectric film 103.

Then, the titanium layer 123 is exposed to ambient air so as to be oxidized, so that the titanium layer 123 changes into the oxygen-containing titanium layer 122. The resultant structure has the configuration shown in FIG. 4A. Alternatively, oxygen ashing may be used instead of exposure to ambient air. In this case also, the oxygen-containing titanium layer 122 can be formed.

By using the above methods, titanium film formation by physical vapor deposition can be employed instead of employing film formation by hydrogen plasma reduction of titanium tetrachloride.

Variation of Embodiment 2

Next, a variation of embodiment 2 is described.

In the fabrication method of the example semiconductor device of embodiment 2, the step of FIG. 4A is carried out after the structure of FIG. 1A is prepared. Specifically, the oxygen-containing titanium layer 122 is formed after the removal of the oxide layer formed on part of the surface of the metal-containing compound layer 102 which is exposed at the bottom of the contact hole 104. Thereafter, the manganese oxide layer 119 is formed as shown in FIG. 4B.

Figure 8:
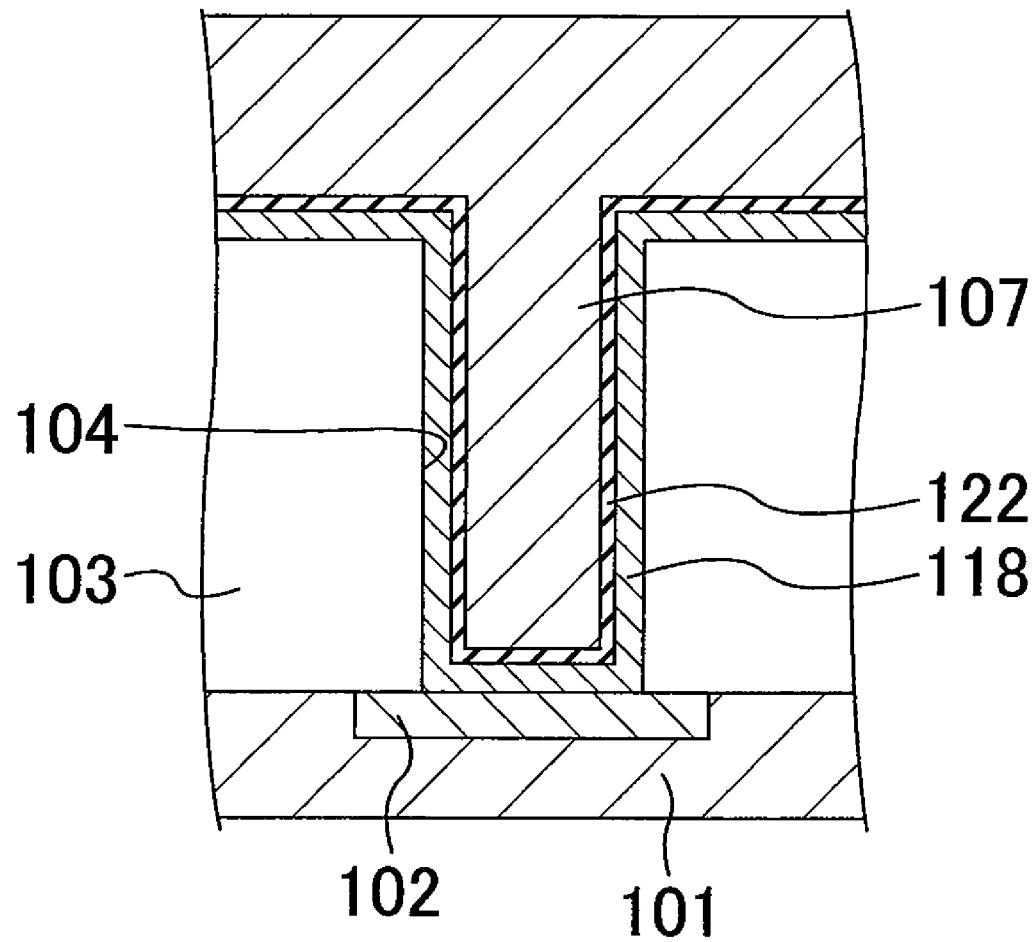
FIG. 8 shows a variation of embodiment 2.
Figure 9:
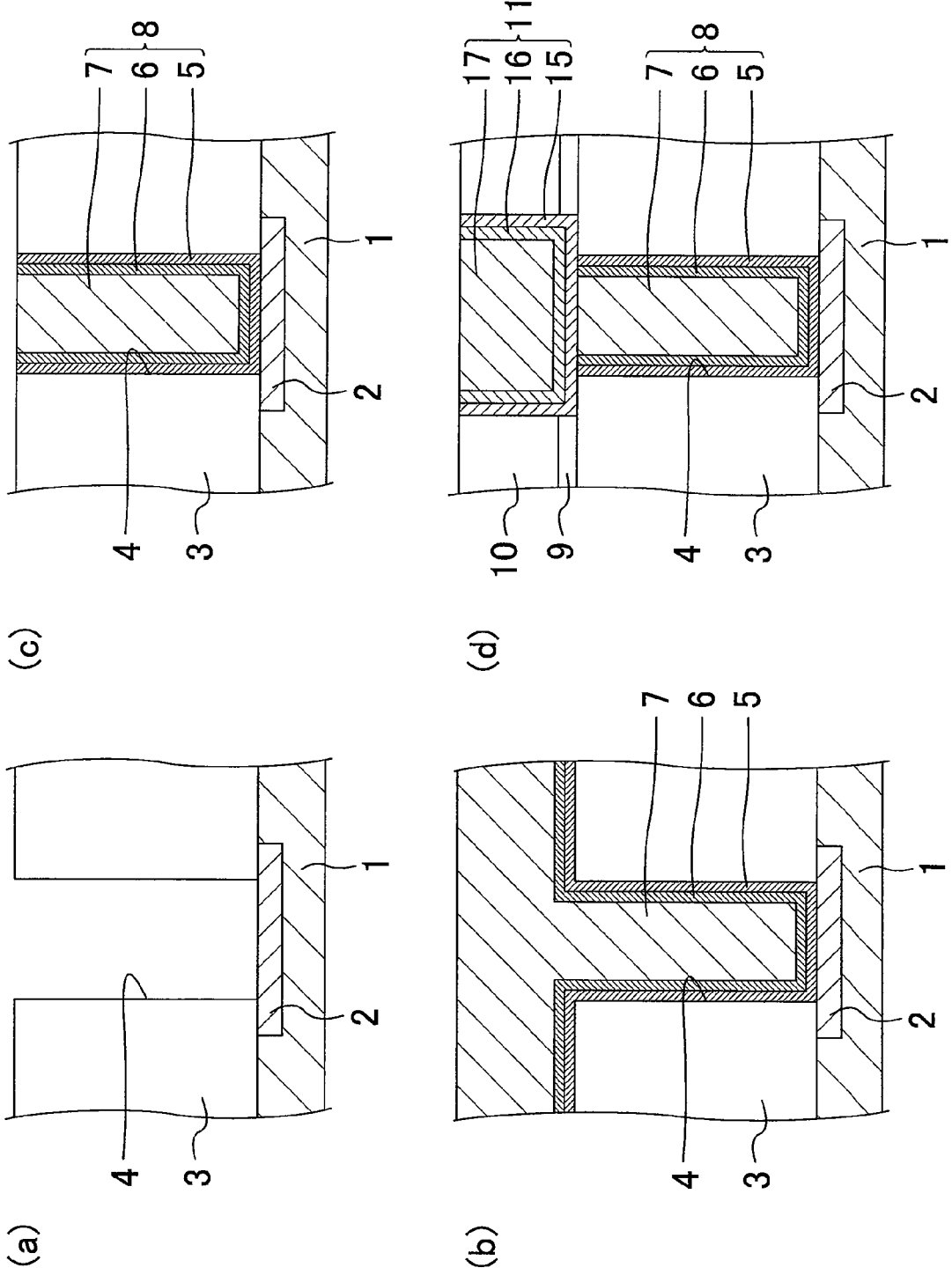
FIGS. 9A-9D illustrate a background art semiconductor device and a fabrication method thereof.

On the other hand, in this variation, after the structure of FIG. 1A is prepared, the copper-manganese alloy layer 118 is formed without removing the oxide layer. Thereafter, the oxygen-containing titanium layer 122 is formed so as to cover the copper-manganese alloy layer 118. Then, the copper layer 107 is formed over the oxygen-containing titanium layer 122 so as to fill the contact hole 104. The resultant structure is shown in FIG. 8. Note that the copper layer 107 may be formed by plating after the formation of the seed layer.

Thereafter, the resultant structure is thermally treated so that manganese atoms contained in the copper-manganese alloy layer 118 cause a reaction with oxygen atoms to form the manganese oxide layer 119.

In this case, the oxygen atoms reacting with the manganese atoms are supplied from the oxide layer formed on the surface of the metal-containing compound layer 102 and from the oxygen-containing titanium layer 122 formed over the copper-manganese alloy layer 118. Therefore, even when the oxide layer has a small thickness so that the amount of oxygen supplied is insufficient, the oxygen atoms supplied from the oxygen-containing titanium layer 122 ensure the formation of the manganese oxide layer 119.

What is claimed is:

1. A semiconductor device, comprising:
    a metal-containing compound layer on a semiconductor substrate;
    a dielectric film on the semiconductor substrate and the metal-containing compound layer;
    a contact hole penetrating through the dielectric film to reach the metal-containing compound layer;
    a contact plug in the contact hole; and
    a manganese oxide layer extending between the contact plug and respective one of the dielectric film and the metal-containing compound layer.

2. The semiconductor device of claim 1, further comprising an oxygen-containing titanium layer extending between the contact plug and the manganese oxide layer or between the manganese oxide layer and respective one of the dielectric film and the metal-containing compound layer.

3. The semiconductor device of claim 1, wherein the metal-containing compound layer includes silicon and at least one of cobalt, nickel, germanium and platinum.

4. The semiconductor device of claim 1, wherein the dielectric film is a single-layer oxygen-containing dielectric film or a multilayered film including a plurality of oxygen-containing dielectric films.

5. The semiconductor device of claim 4, wherein the oxygen-containing dielectric film is at least one of P-TEOS film, PSG film, BPSG film, NSG film and FSG film.

6. The semiconductor device of claim 1, wherein the contact plug contains copper.

7. The semiconductor device of claim 1, further comprising a wire on the dielectric film for connecting to the contact plug.

8. A method for fabricating a semiconductor device, comprising:
    (a) forming a metal-containing compound layer on a semiconductor substrate;
    (b) forming a dielectric film on the semiconductor substrate and the metal-containing compound layer;
    (c) forming a contact hole in the dielectric film to reach the metal-containing compound layer;
    (d) after (c), oxidizing part of the metal-containing compound layer exposed at a bottom of the contact hole to form an oxygen- and metal-containing compound layer;
    (e) after (d), forming a manganese-containing alloy layer over the bottom and side wall of the contact hole;
    (f) after (e), forming a contact plug to fill the contact hole; and
    (g) after (f), forming a manganese oxide layer from the manganese-containing alloy layer by a thermal treatment.

9. The method of claim 8, wherein (d) includes performing plasma ashing using a gas which contains oxygen and at least one of fluorine and fluorine compound.

10. The method of claim 8, wherein the metal-containing compound layer includes silicon and at least one of cobalt, nickel, germanium and platinum.

11. The method of claim 8, wherein the dielectric film is a single-layer oxygen-containing dielectric film or a multilayered film including a plurality of oxygen-containing dielectric films.

12. The method of claim 11, wherein the oxygen-containing dielectric film is at least one of P-TEOS film, PSG film, BPSG film, NSG film and FSG film.

13. A method for fabricating a semiconductor device, comprising:
    (a) forming a metal-containing compound layer on a semiconductor substrate;
    (b) forming a dielectric film on the semiconductor substrate and the metal-containing compound layer;
    (c) forming a contact hole in the dielectric film to reach the metal-containing compound layer;
    (d) after (c), forming an oxygen-containing titanium layer over a bottom and side wall of the contact hole;
    (e) after (c) and before or after (d), forming a manganese-containing alloy layer over the bottom and side wall of the contact hole;
    (f) after (d) and (e), forming a contact plug to fill the contact hole; and
    (g) after (f), forming a manganese oxide layer from the manganese-containing alloy layer by a thermal treatment.

14. The method of claim 13, wherein (d) includes forming the oxygen-containing titanium layer by reduction of a titanium-containing compound.

15. The method of claim 14, wherein the titanium-containing compound is at least one of titanium tetrachloride, titanium tetrabromide and titanium tetraiodide.

16. The method of claim 14, wherein the reduction is carried out using hydrogen plasma.

17. The method of claim 13, wherein (d) includes forming the oxygen-containing titanium layer by forming a titanium film and then oxidizing the titanium film.

18. The method of claim 17, wherein oxidizing the titanium film includes exposing the titanium film to ambient air.

19. The method of claim 17, wherein oxidizing the titanium film includes exposing the titanium film to a plasma atmosphere which contains oxygen.

20. The method of claim 17, wherein the titanium film is formed by physical vapor deposition.

21. The method of claim 13, wherein the metal-containing compound layer includes silicon and at least one of cobalt, nickel, germanium and platinum.

22. The method of claim 13, wherein the dielectric film is a single-layer oxygen-containing dielectric film or a multilayered film including a plurality of oxygen-containing dielectric films.

23. The method of claim 22, wherein the oxygen-containing dielectric film is at least one of P-TEOS film, PSG film, BPSG film, NSG film and FSG film.

* * * * *